(12) United States Patent
Yancey et al.

(10) Patent No.: US 7,849,283 B2
(45) Date of Patent: Dec. 7, 2010

(54) LINEAR COMBINER WEIGHT MEMORY

(75) Inventors: Jerry William Yancey, Rockwall, TX (US); Yea Zong Kuo, Rockwall, TX (US)

(73) Assignee: L-3 Communications Integrated Systems L.P., Greenville, TX (US)

( * ) Notice: Subject to any disclaimer, the term of this patent is extended or adjusted under 35 U.S.C. 154(b) by 732 days.

(21) Appl. No.: 11/736,404

(22) Filed: Apr. 17, 2007

(65) Prior Publication Data

US 2008/0263303 A1   Oct. 23, 2008

(51) Int. Cl.
*G06F 13/00* (2006.01)
(52) U.S. Cl. .................. 711/168; 342/194; 370/206
(58) Field of Classification Search .............. 711/168; 375/146; 342/194; 370/206
See application file for complete search history.

(56) References Cited

U.S. PATENT DOCUMENTS

| | | | |
|---|---|---|---|
| 5,175,702 A | 12/1992 | Beraud et al. | |
| 5,784,306 A | 7/1998 | Ogletree | |
| 6,629,117 B2 | 9/2003 | Aizenberg et al. | |
| 7,072,382 B2 * | 7/2006 | Dent | 375/146 |
| 2001/0005875 A1 * | 6/2001 | Abramson et al. | 710/129 |
| 2005/0038842 A1 | 2/2005 | Stoye | |
| 2005/0206564 A1 * | 9/2005 | Mao et al. | 342/377 |

\* cited by examiner

*Primary Examiner*—Yong Choe
(74) *Attorney, Agent, or Firm*—Hovey Williams LLP

(57) ABSTRACT

A linear combiner weight memory. Various embodiments of the weight memory provide a weight bank and control logic. The weight bank is operable to couple with a data stream and may include four registers. The first register is operable to store a first in-phase weight value. The second register is operable to store a second in-phase weight value and be written with the second in-phase weight value while the first in-phase weight value is read from the first register. The third register is operable to store a first quadrature weight value. The fourth register is operable to store a second quadrature weight value and be written with the second quadrature weight value while the first quadrature weight value is read from the third register.

18 Claims, 4 Drawing Sheets

LINEAR COMBINER WEIGHT MEMORY

BACKGROUND

1. Field

Embodiments of the present invention relate to weight memory. More particularly, various embodiments of the invention provide a scalable weight memory operable to retain in-phase and quadrature weight values for use within a linear combiner.

2. Description of the Related Art

Linear combiners and other digital signal processing elements often utilize weight memories to store weight values for processing functions. Typically, weight memories are configured as simple registers where each register retains a different weight value. Unfortunately, such simple weight memory configurations often are difficult to scale, cannot employ complex weight values, and inhibit processing functionality. For example, a single register cannot be written to and read from at the same time, thereby creating a processing delay each time a weight value is modified.

SUMMARY

Embodiments of the present invention solve the above-described problems and provide a distinct advance in the art of weight memories. More particularly, embodiments of the invention provide a scalable weight memory operable to retain in-phase and quadrature weight values for use within a linear combiner.

For example, various embodiments of the present invention provide a weight memory including a weight bank and control logic. The weight bank is operable to couple with a data stream and generally includes four registers. The first register is operable to store a first in-phase weight value. The second register is operable to store a second in-phase weight value and be written with the second in-phase weight value while the first in-phase weight value is read from the first register. The third register is operable to store a first quadrature weight value. The fourth register is operable to store a second quadrature weight value and be written with the second quadrature weight value while the first quadrature weight value is read from the third register. The control logic is operable to control the weight bank to output the first in-phase and quadrature weight values. In some embodiments, the weight memory may include a plurality of weight banks each having two pairs of registers for storing in-phase and quadrature weight values.

Other aspects and advantages of the present invention will be apparent from the following detailed description of the preferred embodiments and the accompanying drawing figures.

BRIEF DESCRIPTION OF THE DRAWING FIGURES

Embodiments of the present invention are described in detail below with reference to the attached drawing figures, wherein.

Figure 1:
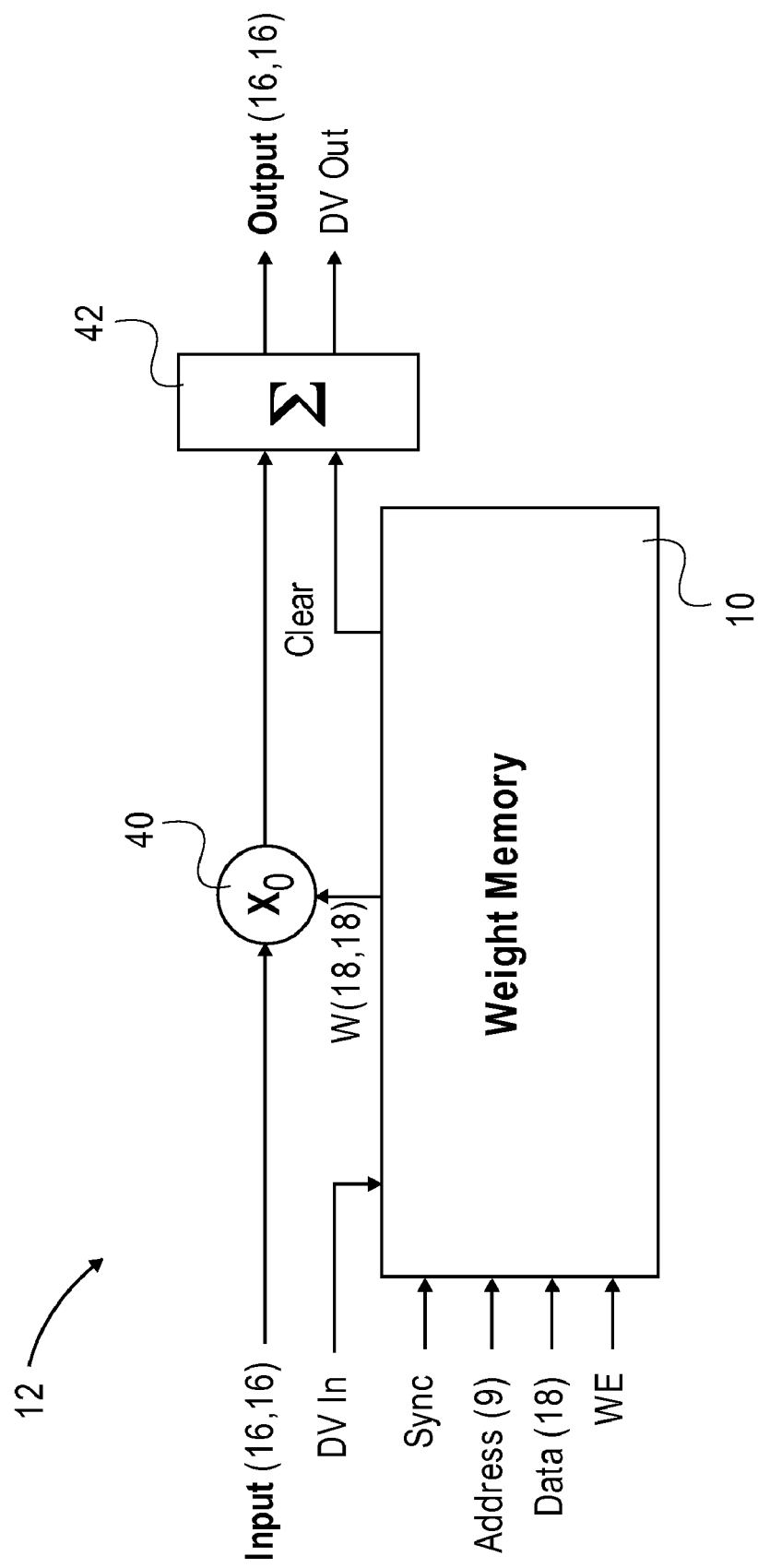
FIG. 1 is a block diagram of a linear combiner including a weight memory configured in accordance with various preferred embodiments of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 2:
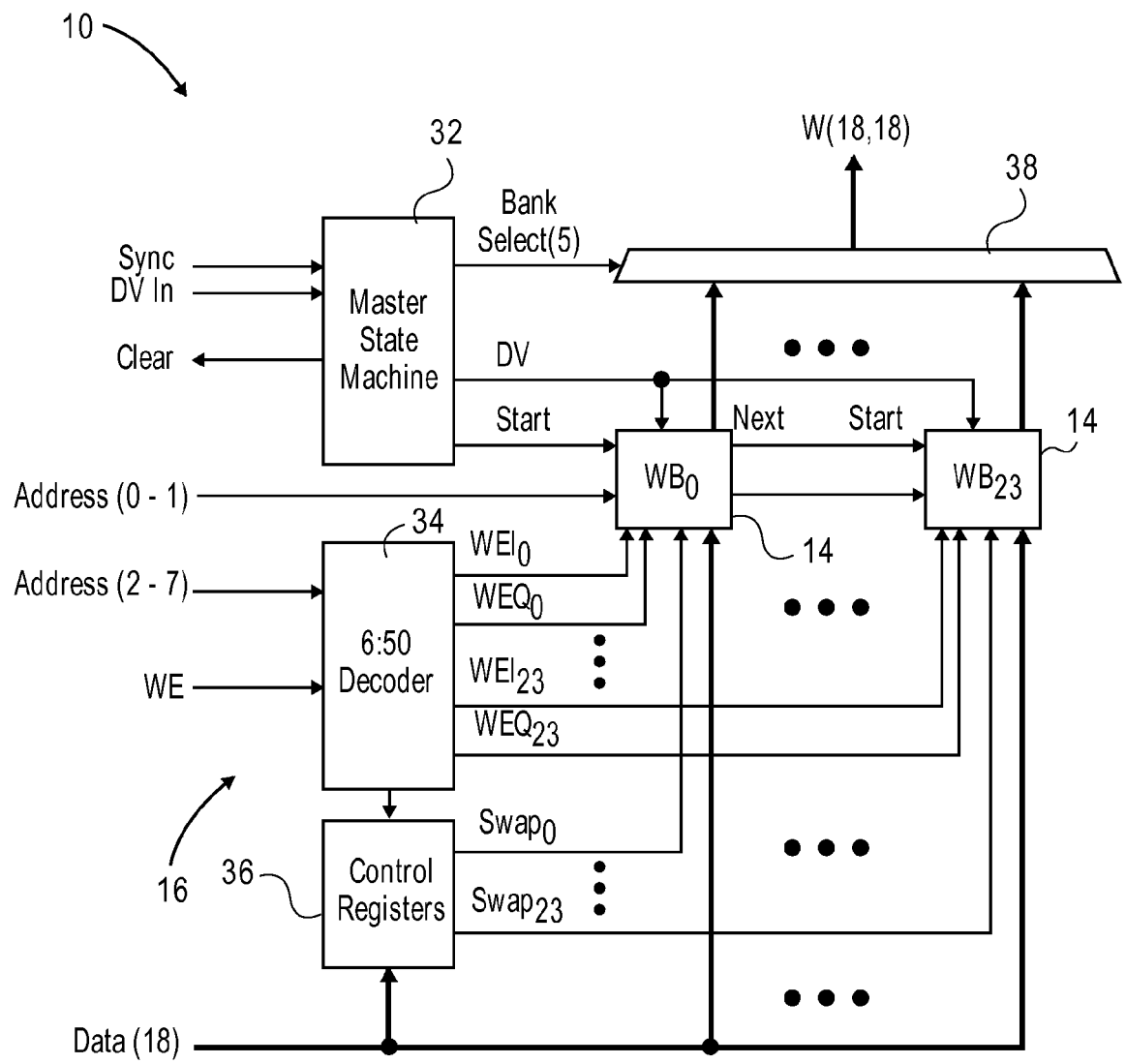
FIG. 2 is a block diagram of the weight memory of FIG. 1 showing various elements in more detail.
Figure 3:
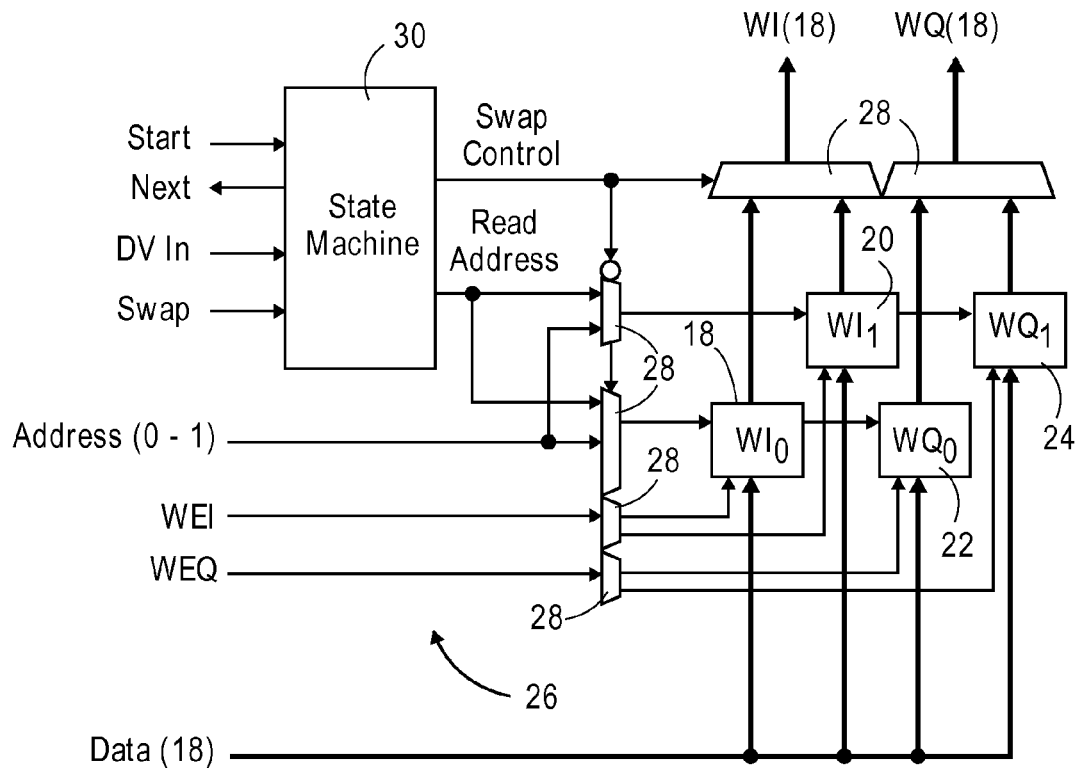
FIG. 3 is a block diagram of a weight bank comprising a portion of the weight memory of FIG. 2.

Referring to FIGS. 1-5, embodiments of the present invention provide a weight memory 10 operable to be utilized by, and/or form a portion of, a linear combiner 12. As shown in FIGS. 2-3, the weight memory 10 may generally include a weight bank 14 operable to store in-phase and quadrature weight values and control logic 16 operable to control the weight bank 14. As is discussed in more detail below, the weight memory 10 may be operable to receive a plurality of inputs from external control elements, such as computing devices, controllers, processors, digital and analog logic, combinations thereof, and the like. The inputs may include configuration inputs, address inputs, data inputs, combinations thereof, and the like.

As shown in FIG. 3, the weight bank 14 may include a first register 18 operable to store a first in-phase weight value, a second register 20 operable to store a second in-phase weight value, a third register 22 operable to store a first quadrature weight value, and a fourth register 24 operable to store a second quadrature weight value. The registers 18, 20, 22, 24 may include any elements or combination of elements operable to be written to store a value and read to provide the stored value. Thus, the registers 18, 20, 22, 24 may include various memory elements including magnetic memories, optical memories, electronic and flash memories, read-only memories, random-access memories, combinations thereof, and the like. In various embodiments, the registers 18, 20, 22, 24, are operable to store a plurality of values, as is discussed in more detail below. For example, each register 18, 20, 22, 24 may be configured to store four eighteen-bit values, as is shown in FIG. 3.

The registers 18, 20, 22, 24 may be generally configured to form two pairs of registers—a first pair comprising the first and second registers 18, 20 to store in-phase weight values and a second pair comprising the third and fourth registers 22, 24 to store quadrature weight values. The pairing of registers enables the weight bank 14 to provide ping-pong functionality by allowing one register, such as the first register 18, to be read while another register such as the second register 20 is written with a new value or otherwise refreshed. Thus, in some embodiments the weight bank 14 is generally operable to be simultaneously read from and written to, thereby improving the performance of digital processing systems such as the linear combiner 12.

Additionally, the weight bank 14 is operable to store in-phase and quadrature weight values to provide complex weight values to digital signal processing elements such as the linear combiner 12. "In-phase" and "quadrature" as utilized herein generally refer to signal characteristics generally given by:

$$I(t)=A(t)\cos[\phi(t)]$$

$$Q(t)=A(t)\sin[\phi(t)]$$

where $A(t)$ and $\phi(t)$ represent possible carrier wave modulations of a particular signal, $I(t)$ represents an in-phase value, and $Q(t)$ represents a quadrature value.

However, the in-phase and quadrature weight values stored by the weight memory 10 to facilitate complex digital signal processing operation may correspond to any complex numbers, including any real and imaginary numbers, and are not limited to the particular in-phase and quadrature configuration discussed above.

As shown in FIG. 3, the weight bank 14 may additionally include weight bank control logic 26 that may be integral with or discrete from the control logic 16. In some embodiments, the weight bank control logic 26 is preferably discrete from the control logic 16 to facilitate scaling of the weight bank 14. For example, in some embodiments, the weight bank 14 may be easily scaled by creating a plurality of duplicates, each duplicate including copies of the registers 18, 20, 22, 24 and weight bank control logic 26.

The weight bank control logic 26 may include any digital or analog electronic components operable to control and/or facilitate functionality of the weight bank 14. Thus, the weight bank control logic 26 may include microprocessors, microcontrollers, computing devices, digital and analog logic, combinations thereof, and the like. In some embodiments, the weight bank control logic 26 includes a switching element 28 and a state machine 30 to facilitate operation of the registers 18, 20, 22, 24.

The switching element 28 may include any element or combination of elements operable to selectively provide signals to and from the registers 18, 20, 22, 24. In some embodiments, the switching element 28 may include a plurality of multiplexers, as is shown in FIG. 3. As is discussed in more detail below, the multiplexers are operable to receive control signals from the state machine 30, the control logic 16, or other devices to dictate when the registers 18, 20, 22, 24 are written and which in-phase and quadrature weight values are read and provided to the linear combiner 12 or other digital signal processing elements.

The state machine 30 is generally operable to control the registers 18, 20, 22, 24 in a desired sequence to facilitate reading and writing of in-phase and quadrature weight values. For example, by receiving one or more control signals, the state machine 30 may dictate the order in which the registers are read and written and also control the switching element 28 to dictate which in-phase and quadrature weight values are output.

The control logic 16 provided by the weight memory 10 may include the weight bank control logic 26. However, the control logic 16 is preferably discrete from the weight bank control logic 26 to facilitate scaling of the weight bank 14, as is discussed above. The control logic 16 is generally operable to control the weight bank 14 to read and write various in-phase and quadrature weight values based on one or more control signals. The control logic 16 may acquire the control signals from the linear combiner 12 or from control elements external to the linear combiner 12 such as computing devices, controllers, processors, digital and analog logic, combinations thereof, and the like.

In some embodiments, the control logic 16 may include a master state machine 32, an addressing decoder 34, control registers 36, and an output multiplexer 38. The master state machine 32 is operable to cycle through a desired or particular sequence based on one or more control signals to provide output signals for functioning and/or controlling the weight bank 14 and other weight memory 10 elements including the addressing decoder 34, the control registers 36, and output multiplexer 38. The master state machine 32 may include any digital or analog elements operable to function as a state machine, including processors, controllers, memory elements, discrete digital and analog logic devices, combinations thereof, and the like.

The addressing decoder 34 is operable to receive control signals indicating one or more desired memory address for reading or writing. Based on the received control signal or signals, the addressing decoder 34 is operable to provide addressing output signals to control the functionality of the weight bank 14 and associated registers 18, 20, 22, 24. The addressing decoder 34 may include any digital or analog elements operable to decode memory addresses including processors, controllers, memory elements, discrete digital and analog logic devices, combinations thereof, and the like. Thus, in embodiments where each register 18, 20, 22, 24 is operable to store a plurality of weight values each having an address, the addressing decoder 34 is operable to control each weight bank 14 in combination with the master state machine 30 to define how data is read to and from each register address.

The control registers 36 may be coupled with the input data stream, the addressing decoder 34, and the weight bank 14 to facilitate the writing of in-phase and quadrature weight values. In various embodiments, the control registers 36 are operable to store and provide control commands to the state machine 30. The control registers 36 may comprise any various memory elements including magnetic memories, optical memories, electronic and flash memories, read-only memories, random-access memories, combinations thereof, and the like.

In embodiments where the weight memory 10 includes a plurality of weight banks 14, the output multiplexer 38 is coupled with each of the weight banks 14 to select which weight values are provided to the linear combiner 12 or other digital signal processing elements. The output multiplexer 38 may be coupled with the master state machine 32 to enable the master state machine 32 to select particular weight values from particular weight banks 14. For example, in some embodiments the weight memory 10 may include twenty-four weight banks 14 and the output multiplexer 38 is operable to multiplex the outputs of the weight banks 14 to provide particular weight values to the linear combiner 12 or other digital signal processing elements. However, in some embodiments the weight memory 10 does not include the output multiplexer 38 as each weight bank 14 may directly output its weight values for parallel usage by other linear combiner 12 elements.

The weight memory 10 may easily be configured to retain any number of weight values for use in any digital signal processing systems due to the scalable nature of the weight bank 14. For example, the weight bank 14 may be easily replicated to store additional weight values for use in serial or parallel linear combiners having any number of inputs for real or complex operation. Similarly, the scalable and easily configurable nature of the weight memory 10 provides for adjustable numeric precision through the retention of any number or combination of in-phase and quadrature weight values. Further, the utilization of the weight bank control logic 26 improves synthesis of the weight memory 10 by generally avoiding the use of large multiplexers.

Figure 5:
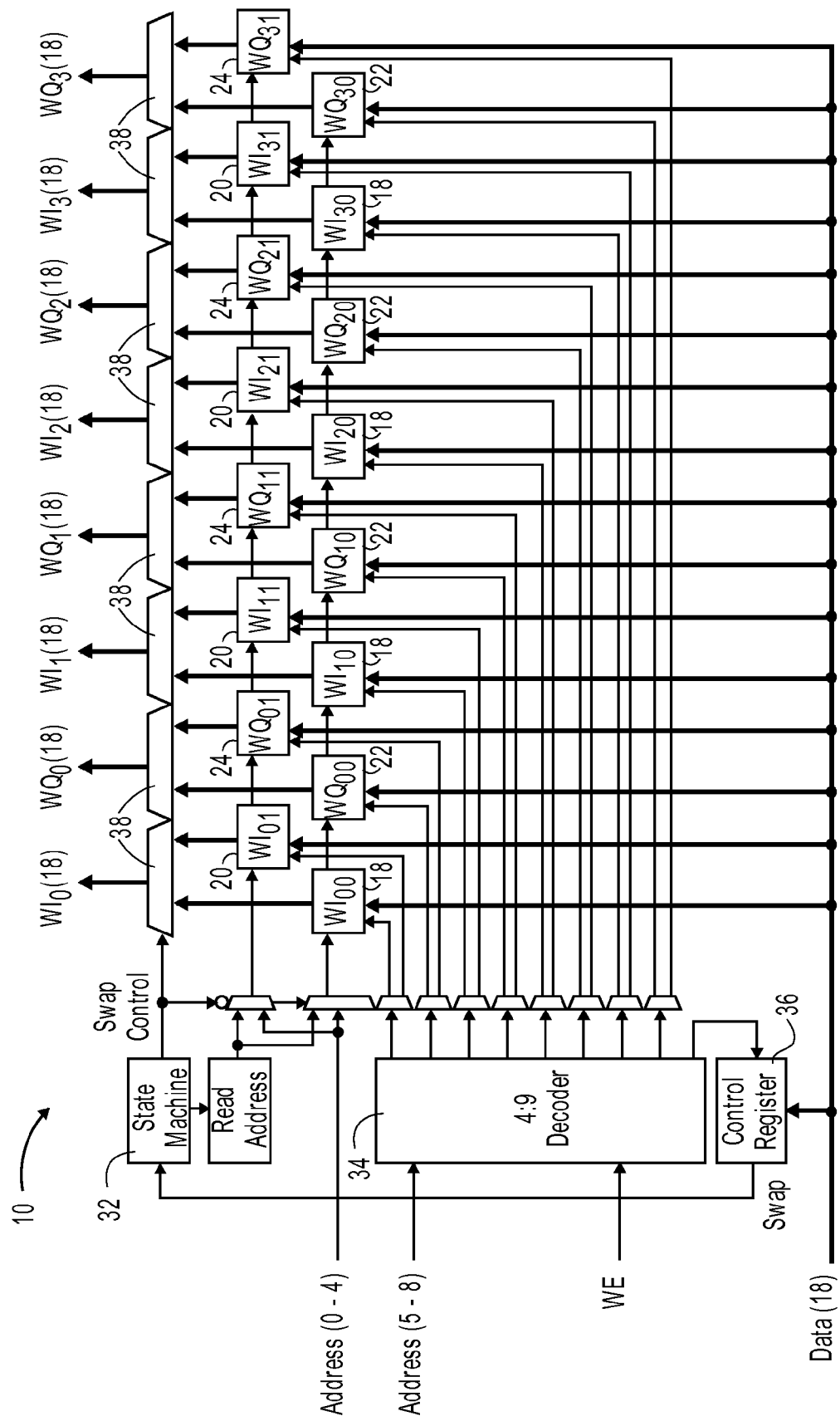
FIG. 5 is a block diagram of the weight memory of FIG. 4 showing various elements in more detail.

In some embodiments where the weight memory 10 provides a plurality of parallel in-phase and quadrature outputs, as shown in FIG. 5, each weight bank 14 may omit the weight bank control logic 26. Thus, in some embodiments each weight bank 14 may generally include the four registers 18, 20, 22, 24. Each weight bank 14 may be coupled with the control logic 16, including the master state machine 32, the addressing decoder 34, and the control registers 36, to function in a desired manner. The output multiplexer 38 may include a plurality of multiplexers each configured in a similar manner to the switching element 28 discussed above, to control the output of the various registers of each weight bank 14.

In some embodiments, the weight memory 10 may be coupled with other digital signal processing elements to form the linear combiner 12. For example, as shown in FIG. 1, the weight memory 10 may be utilized in combination with a multiplication element 40 and a summation element 42 to form the linear combiner 12.

The multiplication element 40 is generally operable to receive the in-phase and quadrature weight values from the weight memory 10 and multiply the weight values with an input signal. The summation element 42 may be coupled with the multiplication element 42 and is generally operable to sum the products provided by the multiplication element 40 to provide an output signal representing a combined signal.

The multiplication element 40 may comprise any element or combination of elements operable to multiply at least a portion of an input signal by at least a portion of an in-phase or quadrature weight value. Preferably, the multiplication element 40 is configured for complex multiplication utilizing the quadrature and in-phase values provided by the weight memory 10. Thus, the multiplication element 40 may comprise discrete analog and digital components, processors, microcontrollers, computing devices, combinations thereof, and the like.

In some embodiments, as shown in FIG. 1, the multiplication element 40 is operable to serially receive weight values from the weight memory 10 and serially multiply the weight values and the input signal. Thus, for example, the weight memory 10 may first provide the first in-phase and quadrature weight values stored within the registers 18, 22 and the multiplication element 40 may then multiply the first in-phase and quadrate weight values by the input signal or a portion of the input signal. The weight memory 10 may then provide the second in-phase and quadrature weight values from the registers 20, 24 and the multiplication element 40 may then multiply the second in-phase and quadrature weight values by the input signal or a portion of the input signal. As discussed above, while two of the registers 18, 22 or 20, 24 are being read, the other two registers 18, 22 or 20, 24 may be written with new values. Thus, the weight memory 10 may serially output weight values for serial multiplication by the multiplication element 40 without interruption from writing delays. Further, in embodiments where each register 18, 20, 22, 24 is operable to store a plurality of weight values, the multiplication element 40 may serially multiply each of the stored weight values with the input signal.

Figure 4:
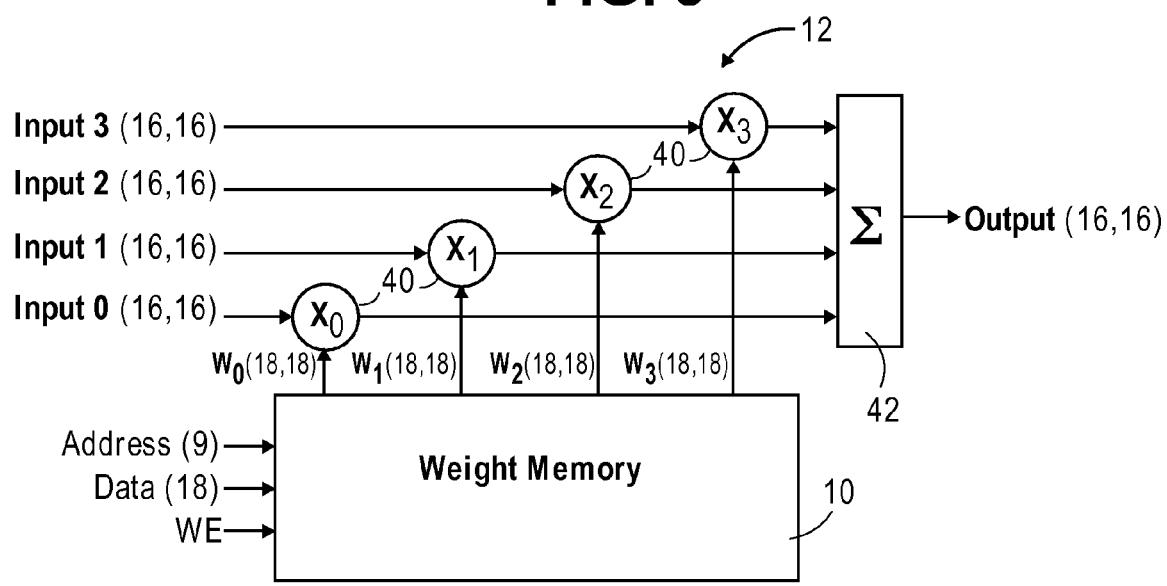
FIG. 4 is a block diagram of another linear combiner including a weight memory configured in accordance with various other preferred embodiments of the present invention.

In some embodiments, as shown in FIG. 4, the multiplication element 40 may include a plurality of multiplication elements each operable to receive at least one in-phase weight value and at least one quadrature weight value from the weight memory 10 and multiply the received weight values with at least a portion of the input signal. Thus, for example, the registers 18, 22 of each weight bank 14 may output first in-phase and quadrature weight values for parallel multiplication by the multiplication element 40. The registers 20, 24 of each weight bank 14 may then output second in-phase and quadrature weight values for parallel multiplication by the multiplication element 40. As discussed above, while two of the registers 18, 22 or 20, 24 of each weight bank 14 are being read, the other two registers 18, 22 or 20, 24 of each weight bank 14 may be written with new values.

The summation element 42 may comprise any element or combination of elements operable to sum values provided by the multiplication element 40. Preferably, the summation element 42 is configured for complex summation of complex values provided by the multiplication element 40. Thus, the summation element 42 may comprise discrete analog and digital components, processors, microcontrollers, computing devices, combinations thereof, and the like. In some embodiments, as shown in FIG. 1, the summation element 42 may serially sum values provided by the multiplication element 40. In other embodiments, as shown in FIG. 4, the summation element 42 may sum values provided by the plurality of multiplication elements in parallel.

The multiplication element 40 and/or the summation element 42 may be coupled with the control logic 16 to enable various desired functionality. For example, the summation element may be operable to receive a reset signal from the control logic 16 to reset its summed value and allow a new linear combination to be formed. As should be appreciated, the multiplication element 40 and the summation element 42 may provide any conventional linear combiner functionality.

As discussed above, the weight memory 10, multiplication element 40, and summation element 42 may be implemented utilizing various analog and digital hardware such as integrated circuits. However, at least portions of the weight memory 10, multiplication element 40, and summation element 42 may be implemented in software for execution by a computing device to perform the various functions identified herein. Additionally or alternatively, at least a portion of the weight memory 10, multiplication element 40, and summation element 42 may be embodied in a hardware description language (HDL) such as Verilog or VHDL for implementation with a programmable logic device such as a field programmable gate array (FPGA). As should be appreciated, the scalable weight memory 10 discussed herein is ideally suited for implementation with HDLs.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A weight memory comprising:
   a weight bank operable to couple with a data stream, the weight bank including:
   a first register operable to store a first in-phase weight value,
   a second register operable to store a second in-phase weight value and be written with the second in-phase weight value while the first in-phase weight value is read from the first register,
   a third register operable to store a first quadrature weight value, and
   a fourth register operable to store a second quadrature weight value and be written with the second quadrature weight value while the first quadrature weight value is read from the third register; and control logic coupled with the weight bank and including a multiplexer and a state machine operable to control the weight bank in a desired sequence to facilitate reading and writing of the first in-phase and quadrature weight values.

2. The weight memory of claim 1, wherein the weight memory further includes a plurality of weight banks each having a first pair of registers operable to store in-phase weight values and a second pair of registers operable to store quadrature weight values.

3. The weight memory of claim 1, wherein the weight memory is operable to provide in-phase and quadrature weight values for use in a linear combiner.

4. The weight memory of claim 1, wherein each register is operable to store a plurality of weight values.

5. The weight memory of claim 4, wherein the control logic is operable to receive address information and control the registers to read and write based on the received address information.

6. The weight memory of claim 1, wherein the control logic is further operable to control the weight bank to output the second in-phase and quadrature weight values.

7. A weight memory comprising:
a plurality of weight banks each operable to couple with a data stream, each weight bank including:
a first pair of registers operable to store in-phase weight values such that one in-phase weight value may be read from one of the registers while another in-phase weight value is written to the other register, and
a second pair of registers operable to store quadrature weight values such that one quadrature weight value may be read from one of the registers while another quadrature weight value is written to the other register; and
control logic coupled with the weight banks and including a multiplexer and a state machine operable to control the weight banks in a desired sequence to facilitate reading and writing of in-phase and quadrature weight values from the registers.

8. The weight memory of claim 7, wherein the weight memory is operable to provide in-phase and quadrature weight values for use in a linear combiner.

9. The weight memory of claim 7, wherein each register is operable to store a plurality of weight values.

10. The weight memory of claim 9, wherein the control logic is operable to receive address information and control the registers to read and write based on the received address information.

11. The weight memory of claim 7, wherein the control logic is operable to control the weight banks to serially output a plurality of in-phase and quadrature weight values.

12. The weight memory of claim 7, wherein the control logic is operable to control the weight banks to output in parallel a plurality of in-phase and quadrature weight values.

13. A linear combiner comprising:
a weight memory including:
a weight bank comprising:
a first pair of registers operable to store in-phase weight values such that one in-phase weight value may be read from one of the registers while another in-phase weight value is written to the other register, and
a second pair of registers operable to store quadrature weight values such that one quadrature weight value may be read from one of the registers while another quadrature weight value is written to the other register, and
control logic coupled with the weight bank and including a multiplexer and a state machine operable to control the weight bank in a desired sequence to facilitate reading and writing of in-phase and quadrature weight values from the registers;
a multiplication element coupled with the weight memory, the multiplication element operable to receive the in-phase and quadrature weight values from the weight memory and multiply the weight values with an input signal; and
a summation element coupled with the multiplication element and operable to sum the products provided by the multiplication element to provide an output signal.

14. The linear combiner of claim 13, wherein each register is operable to store a plurality of weight values.

15. The linear combiner of claim 13, wherein the control logic is operable to receive address information and control the registers to read and write based on the received address information.

16. The linear combiner of claim 13, wherein the weight memory includes a plurality of weight banks each having a first pair of registers operable to store in-phase weight values and a second pair of registers operable to store quadrature weight values.

17. The linear combiner of claim 16, wherein the multiplication element is operable to serially receive weight values from the weight memory and serially multiply the weight values and the input signal.

18. The linear combiner of claim 16, further including a plurality of multiplication elements, each multiplication element operable to receive at least one in-phase weight value and at least one quadrature weight value from the weight memory and multiply the received weight values with at least a portion of the input signal.

* * * * *